(12) United States Patent
Zink et al.

(10) Patent No.: US 11,994,568 B2
(45) Date of Patent: May 28, 2024

(54) LOCAL COIL FOR A MAGNETIC RESONANCE SYSTEM, AND METHOD AND TOOL FOR THE MANUFACTURE OF SAME

(71) Applicant: Siemens Healthcare GmbH, Erlangen (DE)

(72) Inventors: Stephan Zink, Nuremberg (DE); Thomas Kundner, Hoechstadt a. d. Aisch (DE)

(73) Assignee: Siemens Healthineers AG, Forchheim (DE)

( * ) Notice: Subject to any disclaimer, the term of this patent is extended or adjusted under 35 U.S.C. 154(b) by 280 days.

(21) Appl. No.: 17/329,345

(22) Filed: May 25, 2021

(65) Prior Publication Data

US 2021/0389398 A1  Dec. 16, 2021

(30) Foreign Application Priority Data

Jun. 10, 2020  (DE) ...................... 10 2020 207 255.8

(51) Int. Cl.
*G01R 33/34* (2006.01)
*G01R 33/3415* (2006.01)

(52) U.S. Cl.
CPC . *G01R 33/34084* (2013.01); *G01R 33/34007* (2013.01); *G01R 33/3415* (2013.01)

(58) Field of Classification Search
CPC ........ G01R 33/34084; G01R 33/34007; G01R 3/3415
See application file for complete search history.

(56) References Cited

U.S. PATENT DOCUMENTS

| | | | |
|---|---|---|---|
| 7,446,531 B2 * | 11/2008 | Schnell | G01R 33/341 324/318 |
| 7,965,081 B2 * | 6/2011 | Kundner | G01R 33/341 324/309 |
| 2005/0174117 A1 | 8/2005 | Greim et al. | |
| 2009/0012389 A1 | 1/2009 | Kundner et al. | |
| 2010/0010337 A1 | 1/2010 | Hagen et al. | |
| 2012/0256633 A1 | 10/2012 | Biber et al. | |
| 2013/0021035 A1 | 1/2013 | Kundner et al. | |

(Continued)

FOREIGN PATENT DOCUMENTS

| | | |
|---|---|---|
| CN | 101361658 A | 2/2009 |
| CN | 101625401 A | 1/2010 |

(Continued)

OTHER PUBLICATIONS

German Office Action dated May 20, 2021.

*Primary Examiner* — Colin T. Sakamoto
(74) *Attorney, Agent, or Firm* — Harness, Dickey & Pierce, P.L.C.

(57) ABSTRACT

A local coil of an embodiment includes a flat carrier body, at least one ventilation opening, and an antenna array for receiving RF signals in the frequency and power range of a magnetic resonance device. The flat carrier body is made of a reversibly deformable material and is moldable to the patient's shape. An embodiment of the invention further relates to a magnetic resonance system including a magnetic resonance device, a local coil and an electrical connecting cable. A method additionally relates to a method of manufacturing the local coil. A tool is further for use in a manufacturing process of a local coil.

12 Claims, 9 Drawing Sheets

(56) References Cited

U.S. PATENT DOCUMENTS

| | | | |
|---|---|---|---|
| 2013/0184566 A1 | 7/2013 | Kreischer et al. | |
| 2013/0241557 A1 | 9/2013 | Biber et al. | |
| 2015/0196255 A1 | 7/2015 | Rehner | |
| 2017/0067973 A1* | 3/2017 | Hyun | A61B 5/055 |
| 2018/0017643 A1 | 1/2018 | Zink | |
| 2018/0136293 A1* | 5/2018 | Xie | G01R 33/34007 |
| 2018/0284202 A1 | 10/2018 | Biber | |
| 2018/0313915 A1 | 11/2018 | Zink | |
| 2018/0372816 A1 | 12/2018 | Nowak et al. | |
| 2019/0154773 A1 | 5/2019 | Stack et al. | |
| 2019/0162800 A1 | 5/2019 | Schnell et al. | |
| 2020/0081082 A1 | 3/2020 | Kundner et al. | |
| 2020/0096582 A1* | 3/2020 | Greiser | G01R 33/34084 |
| 2020/0132789 A1* | 4/2020 | Candidus | H01F 27/28 |
| 2020/0233048 A1* | 7/2020 | Corea | H05K 3/103 |
| 2020/0271738 A1* | 8/2020 | Qin | G01R 33/34084 |
| 2020/0292641 A1* | 9/2020 | Greiser | G01R 33/34084 |
| 2020/0408860 A1* | 12/2020 | Taracila | G01R 33/3415 |
| 2021/0055362 A1* | 2/2021 | Feng | A61B 5/6843 |

FOREIGN PATENT DOCUMENTS

| | | |
|---|---|---|
| CN | 102998641 A | 3/2013 |
| CN | 103208671 A | 7/2013 |
| CN | 203385841 U | 1/2014 |
| CN | 104771168 A | 7/2015 |
| CN | 108072854 A | 5/2018 |
| CN | 207867013 U | 9/2018 |
| CN | 108761362 A | 11/2018 |
| CN | 108802639 A | 11/2018 |
| CN | 208607345 U | 3/2019 |
| CN | 110895319 A | 3/2020 |
| CN | 210142178 U | 3/2020 |
| CN | 210442501 U | 5/2020 |
| DE | 102004005120 A1 | 8/2005 |
| DE | 102010024432 A1 | 12/2011 |
| DE | 102011007065 A1 | 10/2012 |
| DE | 102011079564 A1 | 1/2013 |
| DE | 102015224969 A1 | 6/2017 |
| DE | 102017210420 A1 | 12/2018 |
| DE | 102018218380 A1 | 4/2020 |
| DE | 102019203628 A1 | 9/2020 |

\* cited by examiner

LOCAL COIL FOR A MAGNETIC RESONANCE SYSTEM, AND METHOD AND TOOL FOR THE MANUFACTURE OF SAME

PRIORITY STATEMENT

The present application hereby claims priority under 35 U.S.C. § 119 to German patent application number DE 102020207255.8 filed Jun. 10, 2020, the entire contents of which are hereby incorporated herein by reference.

FIELD

Example embodiments of the invention generally relate to a local coil comprising a flat carrier body, at least one ventilation opening and an antenna array for receiving RF signals in the frequency and power range of a magnetic resonance device, wherein the flat carrier body is made of a reversibly deformable material and is moldable to a patient's shape. Example embodiments of the invention also generally relate to a magnetic resonance system comprising a magnetic resonance device, a local coil and an electrical connecting cable, and to a method and a tool for manufacturing a local coil.

BACKGROUND

MRI scanners are imaging devices which, in order to image an object under examination, align nuclear spins of the object under examination with a powerful external magnetic field and excite them to precess about this alignment via an alternating magnetic field. The precession or return of the spins from this excited state to a lower-energy state in turn generates in response an alternating magnetic field, also known as a magnetic resonance signal, which is received via antennas.

The magnetic gradient fields are used to position-encode the signals which subsequently enables the received signal to be assigned to a volume element. The received signal is then evaluated and a three-dimensional imaging representation of the object under examination is produced.

To excite spin precession, alternating magnetic fields having a frequency corresponding to the Larmor frequency at the respective static magnetic field strength and very high field strengths or powers are required. To improve the signal-to-noise ratio of the magnetic resonance signal received by the antennas, so-called local coils are often used, which are placed directly on the patient. The local coils usually have antennas in which an electric current is induced via the alternating magnetic field. This can be amplified by a pre-amplifier and finally transmitted as a signal via cable to receiving electronics.

In order to be able to position the local coils as closely as possible to the patient, they are either flexible or rigid and have a shape matching a dedicated region of the patient's body. Rigid local coils are usually made to a standard dimension, which can result in reduced image quality in patients whose body shape does not conform to this standard dimension. Flexible local coils, on the other hand, can be molded to the shape of the patient and can be positioned closer to a signal volume to be examined. This can improve the signal-to-noise ratio of the local coils and optimize image quality compared to rigid local coils.

Since the antennas can have an electric potential during a magnetic resonance measurement, local coils must provide shock protection for the patient. In addition, local coils must be hygienically cleanable because of contact with a large number of patients. The sensitive antenna array is therefore typically embedded in the local coil. In addition to shock protection and cleanability, the local coil must meet other requirements, such as biocompatibility, waterproofness and scratch resistance. The local coil is often composed of a plurality of elements to facilitate incorporation of the antenna array in the carrier body or to allow subsequent maintenance.

SUMMARY

In order to fulfil the above-mentioned requirements and to create a permanently resilient connection, the elements of the local coil are typically interconnected by way of thermal joining processes. However, the inventors discovered that such joining processes can produce creases and/or sharp-edged join lines which make cleaning difficult and absorb moisture. Sharp-edged join lines are produced in particular when joining or bonding one or more outer layers along a peripheral contour of the local coil. Such sharp-edged join lines can cause irritation to the patient's sensitive skin and reduce patient comfort. In addition, the inventors discovered that deformation of the local coil to match the shape of the patient can cause bulging and creasing, particularly in the area of such join lines. In the long term, the inventors discovered that this can lead to separation of composite materials and impede the positioning of the local coil on the patient.

The magnetic resonance system according to the invention comprises a magnetic resonance device, a local coil and an electrical connecting cable, wherein the electrical connecting cable is electrically connected to the termination of the antenna array and the magnetic resonance device and is designed to establish a signal connection between the magnetic resonance device and the antenna array. The termination of the antenna array can be connected to the electrical connecting cable via a socket, as described above. In particular, it is conceivable for the antenna array of the local coil to comprise an arrangement of antennas whose received magnetic resonance signals are transmitted simultaneously to the magnetic resonance device via the electrical connecting cable. The magnetic resonance device can have a receiver channel or a plurality of receiver channels which filter and/or digitize the received signals and transmit them to an evaluation unit comprising a processor. The evaluation unit is preferably designed to derive an image or a spectrum on the basis of the received signals and to output it to a user of the magnetic resonance device via a display unit.

In the inventive method for producing a local coil of an embodiment, the local coil comprises at least one frame element which is integrally bonded to the first outer skin and the second outer skin and spaces the first outer skin apart from the second outer skin, wherein the first outer skin, the second outer skin and the at least one frame element enclose an interspace in which the antenna array and the at least one filler are embedded. A frame element constitutes a flat carrier body having an opening according to the above description. An interspace can be a volume which is partially or completely enclosed by the inner face of the opening of the at least one frame element and of the first outer skin and/or second outer skin. The interspace can contain e.g. the at least one filler and/or the antenna array of the local coil. The method according to the invention comprises the following steps.

The tool according to an embodiment of the invention for manufacturing a local coil comprises a mounting structure having a matrix of retaining elements. A retaining element is preferably constituted by a bolt, a pin, a peg, a hook or the like. Preferably, the shape of a retaining element is essentially cylindrical, but a retaining element can also be a cone, cuboid, pyramid or the like. A cross-sectional shape of a retaining element preferably coincides with the shape of a hole in the arrangement of holes. It is conceivable for the retaining elements of the matrix of retaining elements to be disposed in a predetermined pattern which matches the predetermined pattern of the arrangement of holes.

An embodiment is directed to a local coil, comprising:
  a flat carrier body;
  at least one ventilation opening;
  an antenna array to receive RF signals in a frequency and power range of a magnetic resonance device, the antenna array including a termination to establish an electrical connection to the magnetic resonance device, wherein the antenna array is embedded in the local coil,
  a first outer skin and a second outer skin enclosing the flat carrier body on two main surfaces facing away from one another,
  wherein the first outer skin and the second outer skin are disjunctively and integrally bonded to the flat carrier body,
  wherein the flat carrier body includes a reversibly deformable material and is moldable to a shape of the patient, and
  wherein the local coil includes at least one filler, the at least one filler being unattachedly embedded in the flat carrier body and designed to reduce transmission of at least one of a shear force and a bending force in the local coil upon the local coil being molded to the shape of the patient.

An embodiment is directed to a magnetic resonance system, comprising:
  a magnetic resonance device;
  the local coil of an embodiment; and
  an electrical connecting cable, electrically connected to the termination of the antenna array and the magnetic resonance device and designed to establish a signal connection between the magnetic resonance device and the antenna array.

An embodiment is directed to a method of manufacturing a local coil, the local coil including at least one frame element, integrally bonded to a first outer skin and a second outer skin, to space the first outer skin apart from the second outer skin, the first outer skin, the second outer skin and the at least one frame element enclosing an interspace in which an antenna array and at least one filler are embedded, the method comprising:
  positioning the at least one frame element on the first outer skin and bonding the at least one frame element to the first outer skin, the at least one frame element enclosing a lateral surface of the interspace and the interspace being bounded by the first outer skin in a direction facing the first outer skin;
  positioning the antenna array in the interspace;
  positioning the at least one filler in the interspace and bringing the at least one filler into contact with at least one of the first outer skin and a surface of at least one of the antenna array and the at least one frame element;
  positioning the second outer skin on the at least one frame element and the at least one filler, and bonding the second outer skin to the at least one frame element;
  cutting out at least one of the at least one ventilation opening and an edge region of the at least one frame element, the cutting-out including detaching an arbitrarily shaped volume member, a cut-out volume member including at least one of part of the first outer skin, part of the second outer skin and part of the at least one frame element; and
  performing a joining procedure to integrally bond the at least one frame element to the first outer skin and the second outer skin along at least one of a peripheral face of the local coil and an inner face of the at least one ventilation opening.

A tool for manufacturing the local coil of an embodiment, wherein the tool comprises a mounting structure including a matrix of retaining elements, wherein at least the first outer skin and the at least one frame element is positionable via the arrangement of holes on a matrix of retaining elements and orientable in a position relative to one another.

BRIEF DESCRIPTION OF THE DRAWINGS

Further advantages and details will emerge from the following description of example embodiments with reference to the associated schematic drawings in which.

DETAILED DESCRIPTION OF THE EXAMPLE EMBODIMENTS

Figure 1:
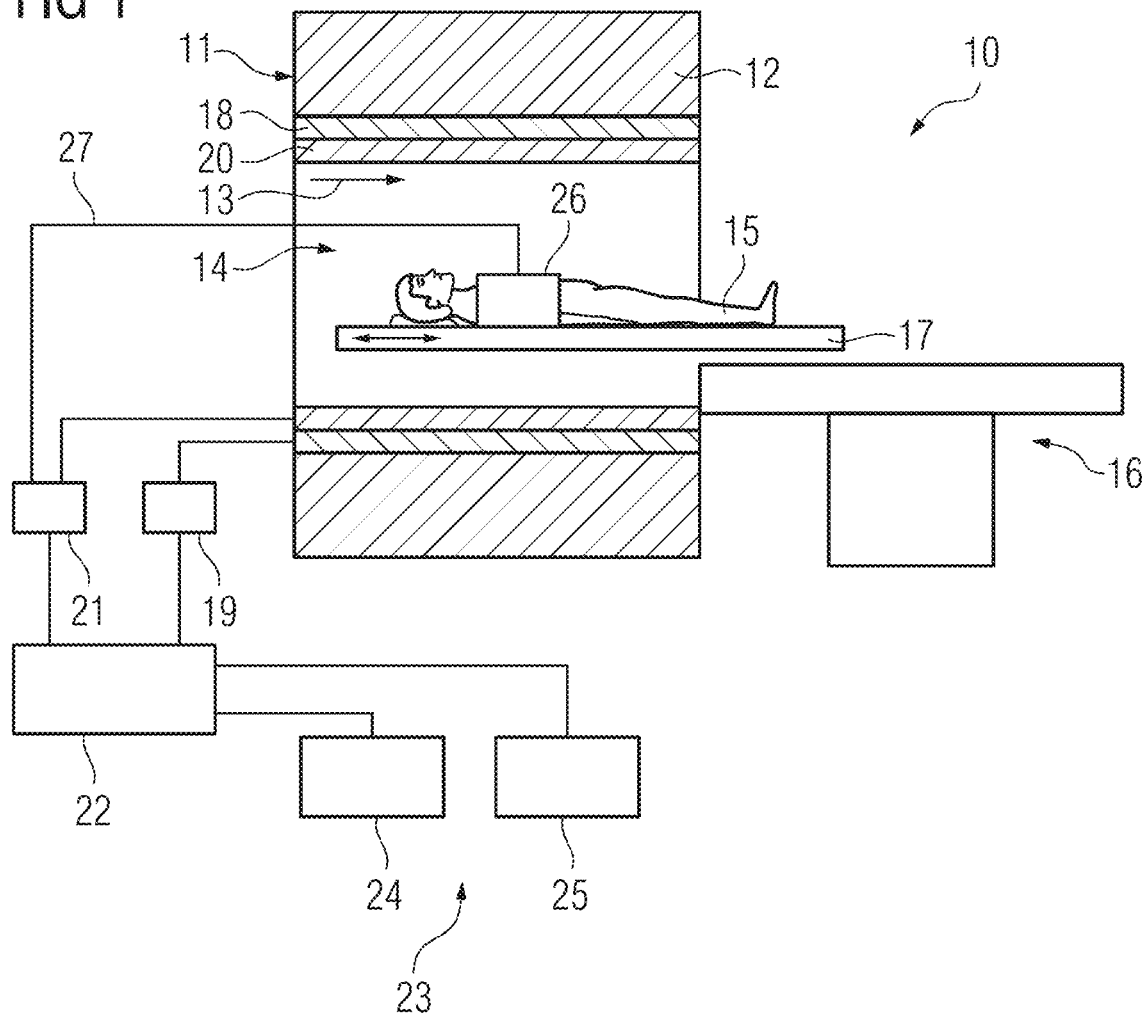
FIG. 1 shows a possible embodiment of a magnetic resonance system according to the invention.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. At least one example embodiment of the present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment of the invention provides a flexible local coil which is easier to use and increases patient comfort.

Embodiments are directed to a local coil, a magnetic resonance system, a method for manufacturing a local coil, and a tool.

The local coil according to at least one embodiment of the invention comprises a flat carrier body, at least one ventilation opening and an antenna array for receiving RF signals in the frequency and power range of a magnetic resonance device. A flat carrier body preferably provides a support structure for other components of the local coil, such as the antenna array, a first outer skin and a second outer skin. The flat carrier body can extend significantly in two spatial directions, e.g. lengthwise and widthwise. However, in a third spatial direction, e.g. heightwise, the flat carrier body preferably has a small dimension compared to the length and width. In an at-rest or initial position, the flat carrier body preferably has planar surfaces on all sides. The flat carrier body can also comprise two main surfaces which are the two sides with the largest surface area.

The local coil according to at least one embodiment of the invention comprises a flat carrier body, at least one ventilation opening and an antenna array for receiving RF signals in the frequency and power range of a magnetic resonance device. A flat carrier body preferably provides a support structure for other components of the local coil, such as the antenna array, a first outer skin and a second outer skin. The flat carrier body can extend significantly in two spatial directions, e.g. lengthwise and widthwise. However, in a third spatial direction, e.g. heightwise, the flat carrier body preferably has a small dimension compared to the length and width. In an at-rest or initial position, the flat carrier body preferably has planar surfaces on all sides. The flat carrier body can also comprise two main surfaces which are the two sides with the largest surface area.

These sides can have any shape such as e.g. a polygonal or oval shape. The sides of the main surfaces of the flat carrier body are preferably rectangular in shape. In particular, the flat carrier body can be implemented as a frame element having a through-hole or opening. The opening of the frame element can be oval or polygonal in shape. It is also conceivable for the frame element to have a plurality of openings and/or to consist of a plurality of frame elements. Other components of the local coil can be positioned in an interspace enclosed by an inner face of the opening of the frame element and/or bonded to the frame element.

A ventilation opening can be a hole on a main surface of the local coil that passes completely through the local coil. The at least one ventilation opening can be of any shape. The ventilation opening can conceivably have an oval shape, a polygonal shape or any combination of these shapes. However, the ventilation opening is preferably circular or square shaped. The ventilation opening can be designed to allow heat transfer from a surface of a patient to a surrounding medium, such as air. This heat transfer can take place by way of natural convection processes which transport heated volume elements of the air away from the surface of the patient and replace them with cooler volume elements.

An antenna array for receiving RF signals in the frequency and power range of a magnetic resonance device can be a coupling element between electromagnetic waves or alternating magnetic fields guided in conductors, and unguided, i.e. propagating in free space. The antenna array is preferably designed to receive alternating electromagnetic fields in the region of the magnetic resonance frequencies of different MR-active nuclei. An RF signal is considered to be e.g. an electromagnetic wave having a frequency of between 1 and 500 MHz, preferably between 10 and 300 MHz. The magnetic resonance signal of common atomic nuclei under examination can have a low power ranging from a few microwatts to several milliwatts.

The antenna array typically comprises at least one antenna or an arrangement of antennas, e.g. an array or a matrix of antennas. An antenna can comprise an electrically conductive wire in which a current is induced by an alternating magnetic field. It is also conceivable for the antenna to be implemented as a track on a printed circuit board. The antenna is preferably made of copper. However, other electrically conductive metals, such as gold or aluminum, as well as combinations thereof, such as a silver-plated or gold-plated copper signal conductor, are also conceivable.

An antenna preferably has a loop-shaped section which receives the RF signal of an alternating magnetic field. A loop constitutes, for example, an approximately noose-shaped section of the antenna. However, the loop can also have other shapes. For example, an oval shape, a polygonal shape or any geometric deformation of these shapes is conceivable. In particular, it is conceivable for the loop to be in the form of a lemniscate or be obtained from the above shapes by torsion, folding, bending and/or distortion. For the antenna configuration, the antennas are disposed e.g. adjacent to one another or partially overlapping in a matrix or array. The matrix can have a regular or an irregular arrangement of antennas. Preferably, the antenna or antenna array is embedded in a flexible printed circuit board and is co-deformable with the local coil.

It is also conceivable for the antenna array to comprise an electronic circuit. The electronic circuit can comprise an assembly of one or more electronic components, such as transistors, resistors, capacitors, diodes, conductive tracks and the like. In particular, the electronic circuit can have protection circuitry suitable for protecting the antenna array against overload. To prevent magnetic attraction forces, standing waves, heating and similar undesirable effects, the electronic circuit can have a high proportion of non-magnetic materials as well as appropriate sheath current filters and/or baluns. However, it is also conceivable for the electronic circuit to comprise electrical conductors as a protective barrier against electromagnetic waves and/or alternating magnetic fields. The electronic circuit preferably comprises a printed circuit board or comparable substrate designed to accommodate the electronic components in a predetermined position relative to one another.

The antenna array additionally has a termination for establishing an electrical connection to the magnetic resonance device. A termination can comprise electrical contacts designed to transmit electrical signals of the antenna array. For this purpose, the termination of the antenna array is preferably connected to an electrical connecting cable which has a signal connection to the magnetic resonance device. The connecting cable can be implemented e.g. as a coaxial cable which has shielding to protect against electromagnetic interference from the environment. The termination of the antenna array can additionally comprise a socket. A socket can be designed to connect the electrical connecting cable electrically and mechanically to the termination of the antenna array. For this purpose, the socket can in particular have a plug-in connector which can be connected to a complementary plug-in connector of the electrical connecting cable.

The antenna array is embedded in the local coil. This can mean that the antenna array is enclosed on its outer periphery by the flat carrier body as well as a first outer skin and a second outer skin. It is conceivable for at least the termination of the antenna array to be accessible from outside the local coil via a recess in the local coil in order to enable the antenna array to be electrically connected to the magnetic resonance device. The local coil preferably has a socket which brings out the electrical contacts of the termination of the antenna array from the local coil and provides a plug-in connector for connecting the electrical connecting cable.

The local coil additionally has a first outer skin and a second outer skin which enclose the flat carrier body on two main surfaces facing away from one another. The first outer skin and the second outer skin are preferably made of a biocompatible material that is resistant to the effects of disinfectants and cleaning agents commonly used in a clinical environment. In particular, a biocompatible material is characterized in that it is free from undesirable side effects on a living object of examination. This can mean that the biocompatible material has high cell and blood compatibility and is histopathologically safe. Examples of suitable materials include plastics such as polyethylenes, polyamides, polyesters and polyurethanes. The material can be both homogeneous and have an additional layer and/or a functional coating. An additional layer or functional coating can, for example, be elastically deformable and/or have a particularly low surface roughness. The first outer skin and the second outer skin preferably have a particularly low surface roughness on a surface facing away from the flat carrier body in order to prevent the settling of dirt and/or microorganisms and to improve the cleanability of the local coil.

The first outer skin and the second outer skin are bonded to the flat carrier body in a mutually disjunctive manner. This can mean that the first outer skin and the second outer skin are spaced apart and have no points of contact with one another. It is conceivable for the first outer skin and/or the second outer skin to comprise a plurality of layers and/or a functional coating. A layer or a functional coating can in particular be biocompatible, water-repellent and/or elastically deformable and/or have a particularly low surface roughness.

The flat carrier body includes a reversibly deformable material and can be molded to the patient's shape. A reversibly deformable material can be e.g. plastically or elastically pre-formable. The reversibly deformable material can preferably be manually molded to the patient's shape. Possible materials are plastics such as polyethylene, polyurethane, polyamide and polyester, for example. In particular, it is conceivable for the reversibly deformable material to be in the form of foam, fibrous material or the like in order to achieve a low density and thus a light weight. In addition to the plastics mentioned, natural materials such as cotton or hemp fibers are also conceivable. Other components of the local coil, such as a filler and/or a backing layer, can likewise consist of reversibly deformable materials to enable the local coil to be molded to a patient's shape. A patient's shape can be e.g. the entire body, a body part or a body region of the patient. It is also conceivable for the shape of the patient to include a leg, an arm or a hip with an approximately oval cross-sectional area to which the local coil is molded in a partially or completely enclosing manner.

The local coil also comprises at least one filler which is unattachedly embedded in the flat carrier body and is designed to reduce transmission of a shear force and/or a bending force in the local coil when the local coil is molded to the shape of the patient. The at least one filler preferably occupies and/or fills an interspace in the flat carrier body. This can mean that the at least one filler helps to create and/or maintain a gap between the first outer skin and the second outer skin. It is also conceivable for the at least one filler to restrict freedom of movement of the antenna array within the local coil due to the antenna array being embedded in or at least partially enclosed by the at least one filler. The at least one filler is preferably made of an elastically deformable material which is designed to cushion the antenna array. It is also conceivable for the material of the at least one filler to have a low density in order to reduce the weight of the local coil. Possible materials include foams, nonwovens, fibrous materials as well as absorbent cotton or synthetic and natural wool. It is also desirable for the material of the at least one filler to be fire resistant and/or to have thermal and electrical insulating properties. The at least one filler can also be designed as a backing layer which is laid flat in the interspace.

The at least one filler is unattachedly embedded in the flat carrier body. This can mean that a surface of a component of the local coil, such as the first outer skin, the second outer skin and/or the antenna array, has a contact point or a contact surface with the at least one filler, but is displaceable relative to the at least one filler. For example, although the material of the at least one filler can be deformable such that a region of the at least one filler abutting the surface of the second outer skin is moved when the local coil is bent and/or deformed, the material farther away from the surface of the second outer skin remains essentially unmoved. It is also conceivable for the material of the at least one filler to have a low surface roughness and/or low forces of adhesion to a material of another component of the local coil. This can reduce static and/or dynamic friction between the at least one filler and another component of the local coil. In other words, the material of the at least one filler preferably has as little molecular interaction as possible with the flat carrier body, the first outer skin, the second outer skin and/or the antenna array and/or is deformable such that transmission of shear forces and bending forces between a component of the local coil and the at least one filler is inhibited when the local coil is molded to the shape of the patient.

Using the at least one filler unattachedly embedded in the flat carrier body enables transmission of shear forces and bending forces through the local coil to be limited. As a result, the first outer skin and the second outer skin can advantageously be partially decoupled mechanically from one another, thereby enabling creasing to be reduced when the local coil is molded to the shape of the patient. In addition, the first outer skin and the second outer skin are integrally bonded to the flat carrier body in a mutually disjunctive manner, thereby advantageously preventing a sharp-edged join line that can be produced where the first outer skin is bonded to the second outer skin.

In another embodiment of the local coil according to the invention, the first outer skin and the second outer skin extend from a main surface of the local coil round to a peripheral face and/or an inner face of the at least one ventilation opening and are integrally bonded to the flat carrier body, wherein the integral bonding is designed to reduce creasing along the peripheral face of the local coil and/or the inner face of the at least one ventilation opening when the flat carrier body is formed to the shape of the patient. A peripheral face of the local coil is preferably a surface that frames or surrounds the two main surfaces of the local coil. An inner face of the at least one ventilation opening, on the other hand, can be a lateral surface of the hole or through-hole of the ventilation opening.

The first outer skin and the second outer skin can be integrally bonded to the flat carrier body e.g. via a pressure-sensitive adhesive and/or a thermal joining process. Examples of suitable pressure-sensitive adhesives are rubber-based polymers, isoprene-, butadiene- and styrene-based synthetic elastomers as well as various natural and synthetic resins, polyurethanes and silicones. In a thermal joining process, the flat carrier body is preferably bonded to the first outer skin and the second outer skin under elevated temperature and pressure. It is conceivable for the first outer skin and the second outer skin to be pressed against a surface of the flat carrier body. Depending on the materials used, a suitable temperature range of the thermal joining process is e.g. between 50° C. and 100° C., 70° C. and 120° C. or 90° and 150° C. A suitable pressure range can be e.g. a few millibars to a few bars above atmospheric pressure.

The integral bonding of the first outer skin and the second outer skin to the flat carrier body enables creasing along the peripheral face of the local coil and/or the inner face of the at least one ventilation opening to be advantageously reduced. As a result, the local coil can be more easily molded to the shape of the patient and the distance from the antenna array to a surface of the patient can be reduced.

According to another embodiment of the local coil according to the invention, the peripheral face of the local coil and/or the inner face of the at least one ventilation opening have a macroscopically smooth surface. A macroscopically smooth surface is preferably characterized by an outer contour which avoids protruding structures or projections along this contour, such as folds, creases or protruding join lines. It is conceivable for the peripheral face of the local coil and/or the inner face of the at least one ventilation opening to have a circumferential depression. The circumferential depression preferably has a maximum height difference relative to the first outer skin that does not exceed a wall thickness of the first outer skin. To ensure durability in a clinical environment, the maximum wall thickness of the first outer skin can be e.g. 2 millimeters, 1.5 millimeters or one millimeter. However, it is also conceivable for the depression along the peripheral face of the local coil and/or the inner face of the at least one ventilation opening to be filled with a pressure-sensitive adhesive in order to achieve a macroscopically smooth surface. Preferably, the inner face of the at least one ventilation opening is essentially constituted by the flat carrier body. As a result, a transition or height difference from the flat carrier body to the first outer skin and/or the second outer skin on the inner face of the at least one ventilation opening can be avoided.

By providing a macroscopically smooth surface on the peripheral face of the local coil and/or the inner face of the at least one ventilation opening, patient comfort can be advantageously increased during preparation and/or performance of the MRI scan. By avoiding sharp-edged join lines, skin irritations can also be avoided which can occur when the sharp-edged join lines come into contact with the surface of a patient's skin.

In another embodiment of the local coil according to the invention, the local coil comprises a holding device for attaching the local coil to a body region of the patient and molding it to the shape of the patient in an appropriate position. A body region of the patient can be any area of a human body. The body region is preferably part of the human body that can be encompassed or enclosed by a holding device in order to mold the local coil to the shape of the patient in an appropriate position. Examples of such body regions are the legs, the arms, the hip, but also the torso, the head or the shoulders of the patient.

A holding device preferably uses one or more form-fit and/or force-fit connection mechanisms to attach the local coil to a body region of the patient. The holding device can comprise retaining elements such as a strap, a hook-and-loop fastener, a zip fastener, a cord, a hook, a tab, a clamp, a latching element or the like. It is conceivable for the holding device to comprise two complementary and/or interlocking retaining elements which are disposed on different or opposite sides of the local coil and can be interconnected in a form- and/or force-fit manner in order to fix the local coil to the body region of the patient when the local coil is molded to the shape of the patient. The holding device is preferably connected to the surface of the first outer skin and/or the second outer skin in an integrally bonded or force-fit manner. However, it is also conceivable for the holding device to be connected to the flat carrier body in an integrally bonded or force-fit manner and to be guided through the first outer skin and/or the second outer skin via a recess.

By using a holding device, the local coil can be advantageously molded to the shape of the patient and at the same time fixed to a body region of the patient. This allows preparation for the magnetic resonance measurement to be simplified and/or accelerated, thereby increasing the number of magnetic resonance measurements in a predetermined time interval.

In another embodiment of the local coil according to the invention, an antenna of the antenna array is embedded in the local coil in an unattached manner and is displaceable relative to the at least one filler when the local coil is molded to the shape of the patient. Embedding the antenna unattachedly in the local coil can mean that a surface of the flat carrier body, of the first outer skin, of the second outer skin and/or of the at least one filler has a contact point or contact surface with the antenna, but is displaceable relative to the antenna. The antenna or the array of antennas can have a low surface roughness and/or a low molecular interaction with the first outer skin, the second outer skin, the flat carrier body and/or the at least one filler.

It is conceivable for individual sections of the antenna array, such as the electronic circuitry and/or the termination of the antenna array, to be mechanically connected to one or more components of the local coil. However, the antenna or array of antennas extends in an unattached manner within the local coil.

Embedding the antenna in an unattached manner in the local coil advantageously enables transmission of shear forces and/or bending forces through the local coil to be further limited.

In another embodiment of the local coil according to the invention, the second outer skin comprises a recess positioned essentially concentrically with respect to the termination of the antenna array, wherein an edge of the recess of the second outer skin is connected to a socket designed to electrically connect the termination of the antenna array to an electrical connecting cable. A recess can be a hole or perforation through the second outer skin. The recess can have a polygonal or oval shape and any combination of these two shapes. The recess is preferably positioned concentrically with respect to the termination of the antenna array. This can mean that a centroid of the recess is located on an axis with a centroid of the termination of the antenna array. The recess of the second outer skin can be spaced apart from the termination of the antenna array e.g. by the height amount of the at least one filler.

A gap between the termination of the antenna array is preferably compensated by a socket. A socket can be e.g. an adapter or an extension which brings out a plurality of electrical contacts of the termination of the antenna array through the recess of the second outer skin to the surface of the local coil. The socket can be mechanically as well as electrically connected to the termination of the antenna array. A mechanical connection between the termination and the socket can be made by way of any form-fit, force-fit and/or integrally bonded connections. On a side positioned outside the local coil, the socket preferably has a physical interface such as a plug-in contact which can be connected to a plug of the electrical connecting cable. The socket is also connected to an edge of the recess. An edge of the recess can be a subarea of the second outer skin which circumferentially surrounds the recess on the outside. The socket and the second outer skin are preferably integrally bonded together. However, form-fit or force-fit connections are also conceivable. In one example, the socket can be designed to enclose the second outer skin by two surfaces facing away from one another, thereby clamping it.

The recess of the second outer skin advantageously enables the termination of the antenna array to be brought out from inside the local coil to the outside via a socket. In addition, the termination of the antenna array can advantageously be mechanically reinforced by the connection with the socket and the second outer skin, thereby enabling the risk of breakage during connection or positioning of the electrical connecting cable on the patient to be reduced.

In another embodiment of the local coil according to the invention, at least part of the antenna array is guided reciprocally through slots in the at least one filler and/or the backing layer, wherein displacement of the antenna array within the local coil is prevented via the reciprocal guiding in the slots. A slot can be e.g. a hole of any shape or an incision which cuts through the at least one filler and/or the backing layer. A dimension of the slot is preferably matched to a dimension of an antenna of the antenna array so that the antenna can be guided through the slot. Reciprocal guiding of the at least one part of the antenna array through slots can mean that the antenna is guided through a plurality of slots, wherein the antenna is alternately guided from a first side of the at least one filler and/or the backing layer to a second side of the at least one filler and/or the backing layer. The at least one filler and/or the backing layer preferably have at least two slots. It is conceivable for the at least one filler and/or the backing layer to have a plurality of slots, e.g. four, six, eight or more slots.

Reciprocal guiding of the at least one part of the antenna array in the slots of the at least one filler and/or the backing layer provides an advantageous means of setting a desired position of the antenna array in the local coil. Moreover, the antenna array is movably positioned in the slots, thereby advantageously reducing transmission of a shear and/or bending force between the antenna array and the at least one filler and/or the backing layer.

In another embodiment of the local coil according to the invention, the at least one filler and/or the backing layer have a retaining structure designed to hold the electronic circuit in a predetermined position. A retaining structure can be implemented e.g. as a depression matching the shape of the electronic circuit or comprise a fastening element which holds the electronic circuit in a predetermined position on the at least one filler and/or the backing layer. The fastening element can be e.g. a snap fastener, a hook-and-loop element, an adhesive subarea, a plug-in matrix or any structure which connects the electronic circuit to the at least one filler and/or the backing layer in a force-fit, form-fit and/or integrally bonded manner.

By providing a retaining structure, any undesirable displacement of the electronic circuit within the local coil can be advantageously avoided.

The magnetic resonance system according to the invention comprises a magnetic resonance device, a local coil and an electrical connecting cable, wherein the electrical connecting cable is electrically connected to the termination of the antenna array and the magnetic resonance device and is designed to establish a signal connection between the magnetic resonance device and the antenna array. The termination of the antenna array can be connected to the electrical connecting cable via a socket, as described above. In particular, it is conceivable for the antenna array of the local coil to comprise an arrangement of antennas whose received magnetic resonance signals are transmitted simultaneously to the magnetic resonance device via the electrical connecting cable. The magnetic resonance device can have a receiver channel or a plurality of receiver channels which filter and/or digitize the received signals and transmit them to an evaluation unit comprising a processor. The evaluation unit is preferably designed to derive an image or a spectrum on the basis of the received signals and to output it to a user of the magnetic resonance device via a display unit.

It is also conceivable for the magnetic resonance device to have a switching matrix which selects the active receiving channels depending on the patient's body region under examination.

By using a switching matrix between the local coil and the magnetic resonance device, signals can be transmitted from the plurality of antennas of the local coil to the magnetic resonance device only from the antennas that are positioned in the immediate vicinity of the patient's body region to be examined.

In the inventive method for producing a local coil of an embodiment, the local coil comprises at least one frame element which is integrally bonded to the first outer skin and the second outer skin and spaces the first outer skin apart from the second outer skin, wherein the first outer skin, the second outer skin and the at least one frame element enclose an interspace in which the antenna array and the at least one filler are embedded. A frame element constitutes a flat carrier body having an opening according to the above description. An interspace can be a volume which is partially or completely enclosed by the inner face of the opening of the at least one frame element and of the first outer skin and/or second outer skin. The interspace can contain e.g. the at least one filler and/or the antenna array of the local coil. The method according to the invention comprises the following steps.

In a step of the method according to the invention, the at least one frame element is positioned on the first outer skin and bonded to the first outer skin, wherein the at least one frame element encloses a lateral surface of the interspace and wherein the interspace is bounded by the first outer skin in a direction facing the first outer skin. Positioning of the at least one frame element on the first outer skin can involve orienting the at least one frame element relative to a surface of the first outer skin. A cross-sectional area of the through-opening of the frame element can be oriented essentially parallel to the surface of the first outer skin, wherein an imaginary projection area of the at least one frame element on the surface of the first outer skin lies within a peripheral contour of the first outer skin. The at least one frame element is also preferably brought close to the first outer skin when positioned on the first outer skin.

The at least one frame element is preferably integrally bonded to the first outer skin. For this purpose, as described above, a pressure-sensitive adhesive and/or an adhesive foil or the like can be applied to the surface of the first outer skin and/or the at least one frame element which integrally bond the two together when they are joined. By way of the connection of the at least one frame element to the first outer skin, the interspace is delimited by the first outer skin in a direction facing the first outer skin.

In a further step of the method according to the invention, the antenna array is positioned in the interspace. When positioning the antenna array in the interspace, a main surface of the antenna array is preferably oriented parallel to a cross-sectional area of the through-opening of the at least one frame element. The antenna array can be oriented such that an imaginary projection area of the antenna array on the surface of the first outer skin lies within an outline contour of the through-opening of the at least one frame element. The antenna array is then brought into contact with the first outer skin and/or a backing layer and/or the at least one frame element. It is conceivable for a subarea or a plurality of subareas of the antenna array to be connected in a form-fit manner to the at least one frame element when the antenna array is brought into contact with the at least one frame element. However, the antennas of the antenna array are essentially mounted unattached in the interspace. The first outer skin can also have a further layer and/or a functional coating on a side facing the antenna array. However, it is also conceivable for the antenna array to have a covering or a coating layer separating the antenna array from the first outer skin. The covering can be e.g. of a thermally and/or electrically insulating and/or fire-resistant material which protects the patient from electrical shock or burns.

In a further step of the method according to the invention, the at least one filler is positioned in the interspace and brought into contact with the first outer skin and/or a surface of the antenna array and/or the at least one frame element.

As described above, the at least one filler can be e.g. absorbent cotton, wool or other low density material. The at least one filler is preferably positioned in the interspace such that it fills the interspace and coats or covers the surfaces of the first outer skin, the at least one frame element as well as the antenna array and the first outer skin. However, it is also conceivable for the at least one filler to have one or more preformed sections which are arranged in a predetermined position relative to one another in the interspace of the at least one frame element.

In a further step of the method according to an embodiment of the invention, the second outer skin is positioned on the at least one frame element and connected to the at least one frame element. For the positioning of the second outer skin on the at least one frame element, a surface of the second outer skin is aligned essentially parallel to a cross-sectional area of the through-opening of the at least one frame element and is brought up against the at least one frame element. The second outer skin and/or the at least one frame element can have e.g. a pressure-sensitive adhesive and/or an adhesive foil which integrally bond the second outer skin to the second frame element when they are brought together.

In a further step of the method according to an embodiment of the invention, the at least one ventilation opening and/or an edge region of the at least one frame element is cut out, wherein the cutting-out involves detaching an arbitrarily shaped volume element, said cut-out volume element comprising part of the first outer skin and/or part of the second outer skin and/or part of the at least one frame element. Cutting-out of the at least one ventilation opening and/or an edge region of the at least one frame element is preferably performed mechanically in a sawing process, punching process or the like or manually using a knife, a saw or a comparable tool. It is also conceivable for the cutting-out to be performed by a laser cutting process. An edge region of the at least one frame element can be a partial volume of the at least one frame element which comprises part of a peripheral face of the at least one frame element. A peripheral face of the frame element can thus coincide with the peripheral face of the local coil. Preferably, a plurality of ventilation openings are provided by the cutting-out. The number of ventilation openings can be, for example, 2, 4, 6, 8 or more. It is also conceivable for there to be an odd number of ventilation openings. A cut-out for a ventilation opening or of an edge region is preferably made only at the points of the local coil that are underpinned by a frame element.

A further step of the method according to an embodiment of the invention involves a joining process for integrally bonding the at least one frame element to the first outer skin and to the second outer skin along a peripheral face of the local coil and/or an inner face of the at least one ventilation opening. A joining process can be any process that integrally bonds the at least one frame element to the first outer skin and the second outer skin using a pressure-sensitive adhesive and/or elevated temperature and/or elevated pressure. The joining process preferably uses both a pressure-sensitive adhesive and an elevated temperature and pressure.

It is conceivable for the first outer skin and the second outer skin to be guided around an edge of the at least one frame element and/or an edge of the at least one ventilation opening during the joining process and to be connected to the inner face of the at least one ventilation opening and/or the peripheral face of the at least one frame element. For this purpose, the first outer skin and the second outer skin can have an overhang with respect to the edges of the at least one frame element and/or the at least one ventilation opening. Such an overhang of the first outer skin and the second outer skin can be obtained, for example, by separately cutting out the at least one ventilation opening and/or the edge region of the first outer skin and the second outer skin. For this purpose, the cutting-out of the first outer skin and the second outer skin can e.g. already be performed prior to connection to the at least one frame element.

It is also conceivable for the at least one frame element to be compressed along the edge of the at least one ventilation opening and/or the peripheral contour of the local coil by the joining process in order to reinforce the local coil in this region and to eliminate creasing.

By way of the method according to an embodiment of the invention, a local coil with any number of ventilation openings can be provided, which advantageously eliminates creasing when the local coil is molded to the shape of the patient. The described method also enables sharp-edged join lines along the peripheral face of the local coil and the inner face of the at least one ventilation opening to be prevented, thereby increasing patient comfort during the magnetic resonance examination.

In one embodiment of the method according to the invention, a backing layer is positioned in the interspace and brought into contact with the first outer skin. A backing layer preferably has a particularly low surface roughness and/or particularly low forces of adhesion to the surfaces of one or more components of the local coil. It is conceivable for the backing layer to be elastically deformable and/or to have a functional coating. It is also conceivable for the backing layer to comprise further layers. The backing layer is preferably positioned unattached on the first outer skin, so that the first outer skin is displaceable relative to the backing layer when the local coil is molded to the shape of the patient. The backing layer can also constitute a filler in the interspace of the local coil. It is conceivable for the backing layer to be brought into contact with the antenna array and/or the at least one filler in a subsequent step.

By way of the backing layer, the transmission of shear forces and/or bending forces through the local coil when the local coil is molded to the shape of the patient is advantageously limited still further. As a result, tension forces between the components of the local coil can be reduced when the local coil is deformed.

In another embodiment of the method according to the invention, at least the first outer skin and the at least one frame element have an arrangement of holes disposed in a manner complementary to a matrix of retaining elements of a mounting structure, wherein at least the first outer skin and the at least one frame element are oriented in a predetermined position relative to one another by engaging the matrix of retaining elements in the arrangement of holes when the at least one frame element is positioned on the first outer skin. An arrangement of holes can comprise one hole or a plurality of holes distributed in a predetermined pattern on at least the first outer skin and the at least one frame element. The holes can be of any shape. Polygonal or oval shapes such as squares or circles are conceivable.

The first outer skin is preferably oriented on the mounting structure such that the arrangement of holes is aligned congruently with the matrix of retaining elements. The first outer skin can then be brought together with the mounting structure, wherein the matrix of retaining elements engages in the arrangement of holes and the first outer skin is brought into contact with the mounting structure. The at least one frame element can be guided onto the matrix of retaining elements in a similar manner. It is conceivable that further components of the local coil, such as e.g. the backing layer and/or the at least one filler and/or the second outer skin, are positioned in a comparable manner on the mounting structure and guided onto the matrix of retaining elements in a predetermined relative position.

By using the mounting structure, the work involved in aligning the components of the local coil can be advantageously reduced. As a result, the local coil can be manufactured in a more cost-effective and/or time-efficient manner.

In another embodiment of the method according to the invention, the arrangement of holes is positioned in the edge region of the at least one frame element and/or in a region of the at least one ventilation opening and is detached when the at least one ventilation opening and/or the edge region of the at least one frame element is cut out (S6). The arrangement of holes can also be distributed on other components of the local coil, such as e.g. the first outer skin, the at least one filler and/or the backing layer, and be separated from the local coil in the cutting-out process (S6).

Positioning the arrangement of holes in the regions of the local coil that are detached by the cutting-out of the at least one ventilation opening and/or the edge region of the at least one frame element means that a joining process for providing macroscopically smooth surfaces on an inner face of the arrangement of holes can be advantageously avoided. As a result, the manufacturing complexity of the local coil can be reduced and the local coil can be manufactured more cost-effectively.

The tool according to an embodiment of the invention for manufacturing a local coil comprises a mounting structure having a matrix of retaining elements. A retaining element is preferably constituted by a bolt, a pin, a peg, a hook or the like. Preferably, the shape of a retaining element is essentially cylindrical, but a retaining element can also be a cone, cuboid, pyramid or the like. A cross-sectional shape of a retaining element preferably coincides with the shape of a hole in the arrangement of holes. It is conceivable for the retaining elements of the matrix of retaining elements to be disposed in a predetermined pattern which matches the predetermined pattern of the arrangement of holes.

A mounting structure is preferably a flat plate having a substantially planar surface on which the retaining elements are arranged in the predetermined pattern. The mounting structure is preferably made of a dimensionally stable material such as e.g. metal, stone, wood or comparable plastics or composites. It is conceivable for the planar plate of the mounting structure to comprise two essentially planar surfaces which can be aligned parallel to one another. The mounting structure and the matrix of retaining elements can be interconnected in one piece. However, a retaining element of the matrix of retaining elements can also be connected to the mounting structure via a form-fit, force-fit and/or integrally bonded connection.

At least the first outer skin and the at least one frame element can be positioned via the arrangement of holes on the matrix of retaining elements and can be oriented in a predetermined relative position to one another. However, it is also conceivable for other components of the local coil, such as e.g. the at least one filler, the backing layer and/or the second outer skin, to comprise an arrangement of holes and to be positionable in a predetermined relative position on the matrix of retaining elements of the mounting structure.

By using the mounting structure, a plurality of different components of the local coil can be positioned in a predetermined relative position to one another. Laborious aligning of individual components in the individual steps of the manufacturing process can thus be advantageously avoided.

FIG. 1 schematically illustrates an embodiment of the magnetic resonance system, comprising a magnetic resonance device 10, a local coil 26 and an electrical connecting cable 27. The magnetic resonance device 10 comprises a magnet unit 11 which contains e.g. a permanent magnet, an electromagnet or a superconducting main magnet 12 for generating a powerful and, in particular, homogeneous main magnetic field 13 (static magnetic field BO). The magnetic resonance device 10 also comprises a patient tunnel 14 for accommodating a patient. In this example embodiment, the patient tunnel 14 is cylindrical in shape and enclosed in a circumferential direction by the magnet unit 11. In principle, however, designs of the patient tunnel 14 differing from this example are also conceivable.

The patient can be positioned in the patient tunnel 14 by way of a patient positioning apparatus 16 of the magnetic resonance device 10. For this purpose, the patient positioning apparatus 16 comprises a patient table 17 which is designed to be movable within the patient tunnel 14. The magnet unit 11 additionally comprises a gradient coil 18 for generating magnetic field gradients, which is used for position encoding during imaging. The gradient coil 18 is controlled by a gradient control unit 19 of the magnetic resonance device 10. The magnet unit 11 can also comprise an RF antenna which in this example embodiment is implemented as a body coil 20 fixedly incorporated in the magnetic resonance device 10. The body coil 20 is designed to excite atomic nuclei present in the main magnetic field 13 generated by the main magnet 12. The body coil 20 is controlled by an RF unit 21 of the magnetic resonance device 10 and radiates RF signals into an examination chamber essentially constituted by a patient tunnel 14 of the magnetic resonance device 10. The body coil 20 is also designed to receive magnetic resonance signals.

The magnetic resonance device 10 has a control unit 22 for controlling the main magnet 12, the gradient control unit 19 and for controlling the RF unit 21. The control unit 22 is designed to control the execution of a sequence such as e.g. an imaging gradient echo sequence or a TSE sequence. The control unit 22 additionally comprises an evaluation unit 28 for evaluating digitized magnetic resonance signals that are acquired during the magnetic resonance examination.

The magnetic resonance device 10 also comprises a user interface 23 having a signal connection with the control unit 22. Control information such as e.g. imaging parameters and reconstructed magnetic resonance images can be shown to a user on a display unit 24, e.g. on at least one monitor, of the user interface 23. The user interface 23 also comprises an input unit 25 by which parameters of a magnetic resonance measurement can be entered by the user. The magnetic resonance device 10 also has a local coil 26 which is positioned on the patient 15 and transmits magnetic resonance signals of a body region of the patient 15 to the magnetic resonance device 10. The local coil 26 preferably has an electrical connecting cable 27 which provides a signal connection to corresponding receiver channels of the RF unit 21 and the control unit 22. The receiver channels filter and digitize the signal received from the local coil 26 and transfer the data to the evaluation unit 28 which derives an image or spectrum from the data and makes it available to the user via the display unit 24.

Figure 2:
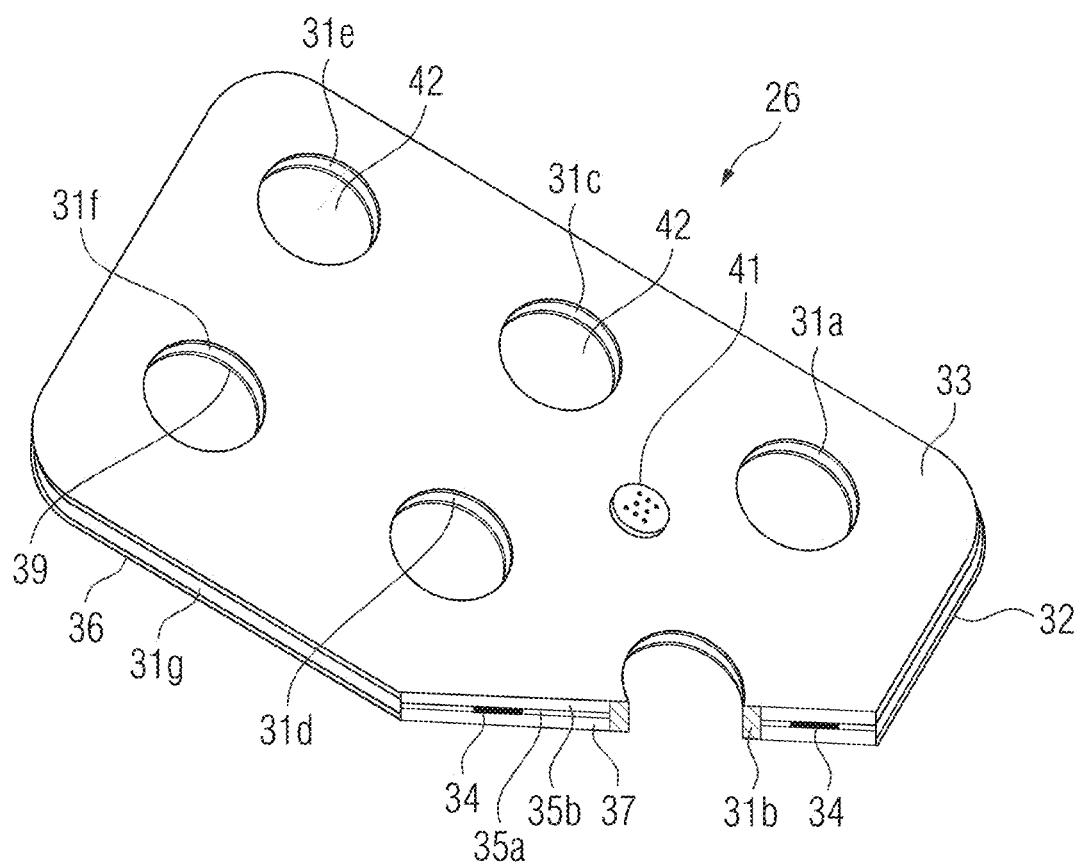
FIG. 2 shows a possible embodiment of a local coil according to the invention.

FIG. 2 shows an embodiment of the local coil 26 according to the invention. In this example, the local coil 26 has six ventilation openings 42 which are uniformly distributed over the local coil 26. On the side having the second outer skin 33, a socket 41 is also provided which can be electrically and mechanically connected to an electrical connecting cable 27. The local coil 26 has a peripheral face 36 along its edge. On the edge of the local coil 26, the first outer skin 32 and the second outer skin 33 are molded to the peripheral face 36 and are integrally bonded to the frame element 31g of the local coil 26. The transition region between the first outer skin 32, the frame element 31g and the second outer skin 33 has a macroscopically smooth surface. It is conceivable for the transition region between the first outer skin 32, the frame element 31g and the second outer skin 33 to have a pressure-sensitive adhesive which compensates for a difference in height between the frame element 31g and the first outer skin 32 and/or the second outer skin 33 on the peripheral face 36. For example, the flat carrier body of the local coil 26 is implemented as a frame element 31g.

FIG. 2 also shows a sectional view of the local coil 26. The sectional view shows the antenna array 34, the fillers 35a and 35b, the backing layer 37 and the frame element 31b which encloses a ventilation opening 42 along the lateral surface. It is also conceivable for the local coil 26 not to have a filler 35a. In this case, the antenna array 34 is merely positioned between the filler 35b and the backing layer 37, thereby increasing the mobility of the antenna array 34. The frame elements 31a, 31b, 31c, 31d, 31e and 31f (31a-f) are preferably designed to mechanically reinforce the ventilation openings 42. In the embodiment shown, the first outer skin 32 and the second outer skin 33 are guided around the edges of the ventilation openings 42 to the inner faces 39 of the ventilation openings 42 and are integrally bonded thereto. In one embodiment, on the other hand, the first outer skin 32 and the second outer skin 33 can also terminate with the edge of the ventilation opening 42 on the surface of the local coil 26, so that the inner face of the ventilation openings 42 is essentially constituted by the frame elements 31a-f.

Figure 3:
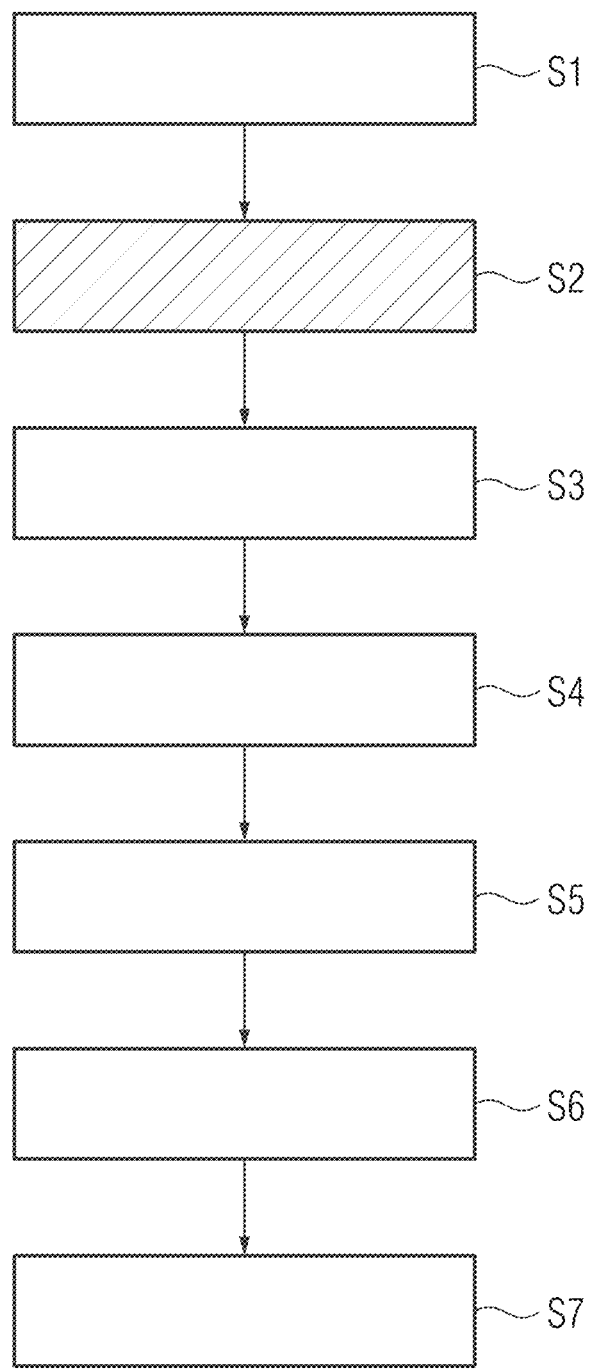
FIG. 3 shows a possible intermediate product of the method according to an embodiment of the invention.

FIG. 3 shows a possible flow chart of an embodiment of the method according to the invention for manufacturing the local coil 26. Individual steps of the method are preferably performed automatically on a dedicated production machine. However, it is also conceivable for the steps to be carried out manually. The components of the local coil 26, such as the first outer skin 32, the frame elements 31a, 31b, 31c, 31d, 31e, 31f, 31g (31a-g) and the second outer skin 33, are preferably disposed on a mounting structure (see FIG. 6) and aligned in a predetermined position relative to one another.

In a step S1, the frame elements 31a-g are positioned on the first outer skin 32 and connected to the first outer skin. For this purpose, a pressure-sensitive adhesive can be applied to the frame elements 31a-g and/or the first outer skin 32 to bond the first outer skin 32 to the frame elements 31a-g.

It is also conceivable that, on a side facing the frame elements 31a-g, the first outer skin 32 is already connected to a backing layer 37 to which the frame elements 31a-g are bonded via the pressure-sensitive adhesive. The first outer skin 32 can also have, on any side, a functional coating that is, for example, biocompatible, water-repellent and/or elastically deformable. Connecting the frame element 31g to the first outer skin 32 creates an interspace 38 (see FIG. 4) which is enclosed along its lateral surface by the frame element 31g and bounded by the first outer skin 32 in the direction of the first outer skin 32.

In optional step S2, the backing layer 37 is positioned in the interspace 38 and brought into contact with the first outer skin 32. In this embodiment of the method, the backing layer 37 is designed as an insert and is placed in an unattached manner against the frame elements 31a-g and the first outer skin 32. However, it is also conceivable for the backing layer 37 to be integrally bonded to the first outer skin 32 in step S2.

In step S3, the antenna array 34 is positioned in the interspace 38 and brought into contact with the backing layer 37. The antenna array 34 preferably comprises a plurality of antennas having flexible circuit boards (e.g. PCBs) which are inserted, e.g. looped, into the interspace 38 of the local coil 26. For positioning it in the interspace 38, it is also conceivable for the antenna array 34 to be connected to one or more of the frame elements 31a-g in a form- or force-fit manner.

In step S4, at least one filler 35 is positioned in the interspace 38 and brought into contact with the surface of the first outer skin 32 or the backing layer 37 and/or the antenna array 34. Preferably, a plurality of fillers 35, such as e.g. the fillers 35a and 35b shown in FIG. 2, are positioned in the interspace 38 to compensate for height differences between the antenna array 34 and the first outer skin 34 or the backing layer 37 and/or to obtain the highest possible packing density in the interspace 38 of the local coil 26. The filler 35b is essentially flush with the surface of the frame elements 31a-g that faces away from the first outer skin 32 (see FIG. 5).

In step S5, the second outer skin 33 is positioned on the frame elements 31a-g and the filler 35b and is integrally bonded to the frame elements 31a-g. Similarly to step S1, a pressure-sensitive adhesive can be applied to the frame elements 31a-g and/or the second outer skin 33 to bond the second outer skin 33 to the frame elements 31a-g. It is also conceivable for the second outer skin 33 to have a functional coating or an additional layer on one side.

The second outer skin 33 can be aligned with the frame elements 31a-g such that a recess in the second outer skin 33 is positioned essentially concentrically with respect to a recess 43 in the filler 35b and the termination 46 of the antenna array 34. However, it is also conceivable for the recess 43 for the termination 46 of the antenna array 34 to be punched or cut out in a subsequent step.

In step S6, the ventilation openings 42 and/or the edge region of the frame element 31g are cut out. The cutting-out involves detaching an arbitrarily shaped volume element (see FIG. 5) which can comprise part of the frame element 31g, but also of the first outer skin 32 and/or of the second outer skin 33. In a possible embodiment of the method according to the invention, parts of the first outer skin 32, of the frame element 31g, as well as parts of the frame elements 31a-f and parts of the second outer skin 33 are detached during the cutting process. However, it is also conceivable that the frame elements 31a-f are hollow cylinders which already have a cut-out for the ventilation openings 42. In this case, the main surfaces of the frame elements 31a-g can be bonded to the first outer skin 32 and the second outer skin 33 as described in steps S1 and S5. When the ventilation openings 42 are cut out in step S6, only the parts of the first outer skin 32 and the second outer skin 33 that cover the ventilation openings 42 are subsequently detached.

In step S7, a joining process is carried out for integrally bonding the frame element 31g to the first outer skin 32 and the second outer skin 33. In this process, the frame element 31g is integrally bonded along the peripheral face 36 and/or the frame elements 31a-f are integrally bonded along the inner faces 39 of the ventilation openings 42 to the first outer skin 32 and the second outer skin 33. The bonding is preferably performed after applying a pressure-sensitive adhesive to the frame element 31g, the frame elements 31a-f, the first outer skin 32 and/or the second outer skin 33. It is conceivable that the joining process comprises heat staking or a comparable joining process, in which the first outer skin 32 and the second outer skin 33 are integrally bonded to the peripheral face 36 and/or the inner face 39 under elevated pressure and temperature.

It should be noted that the described sequence of the method represents only one possible embodiment. It is conceivable, for example, for the method steps to be carried out in a different sequence and/or for individual or a plurality of method steps to be carried out repeatedly.

Figure 4:
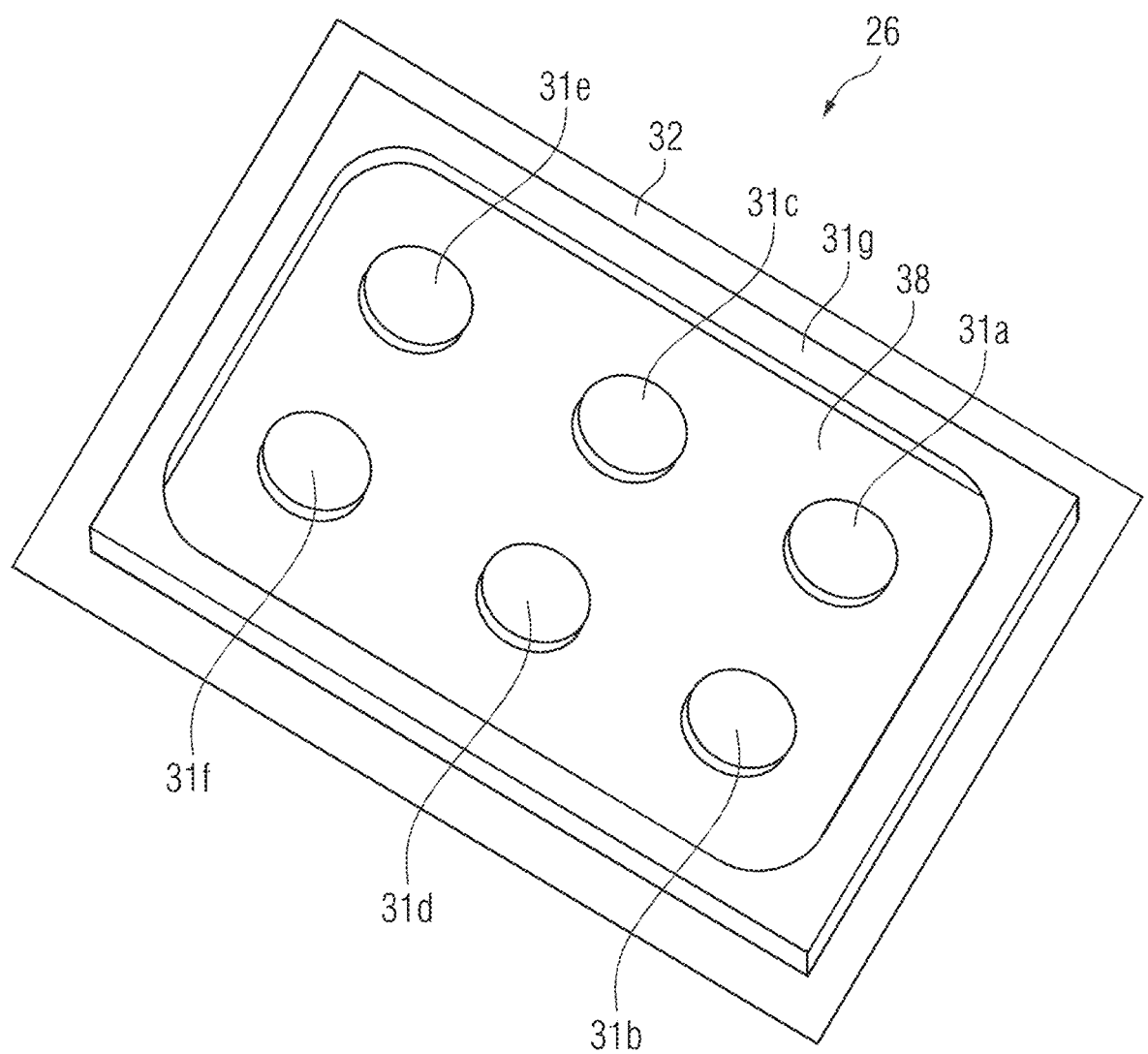
FIG. 4 shows a possible intermediate product of the method according to an embodiment of the invention.

FIG. 4 shows an intermediate product of the local coil 26 according to an embodiment of the invention following step S1 of the method according to an embodiment of the invention. In this state, the frame element 31g as well as the frame elements 31a-f are positioned on the first outer skin 32 and are integrally bonded thereto. The inner face of the frame element 31g facing the frame elements 31a-f encloses an interspace 38 in which further components of the local coil 26 can be positioned. The interspace 38 is bounded by the first outer skin 32 in a direction facing the first outer skin 32. It is conceivable for the first outer skin 32 to extend beyond the frame element 31g, as shown. The first outer skin 32 can be cut to a desired dimension in a method step. In the example shown, the flat carrier body of the local coil 26 is implemented as a cuboidal frame element 31g and also comprises six cylindrical frame elements 31a-f. It is also conceivable for the flat carrier body to have fewer or additional frame elements 31a-f. In a conceivable embodiment, the flat carrier body is implemented as a frame element 31h (see FIG. 7) in which the frame elements 31a-f are connected to the frame element 31g in one piece or in an integrally bonded manner, e.g. via webs or rails.

Figure 5:
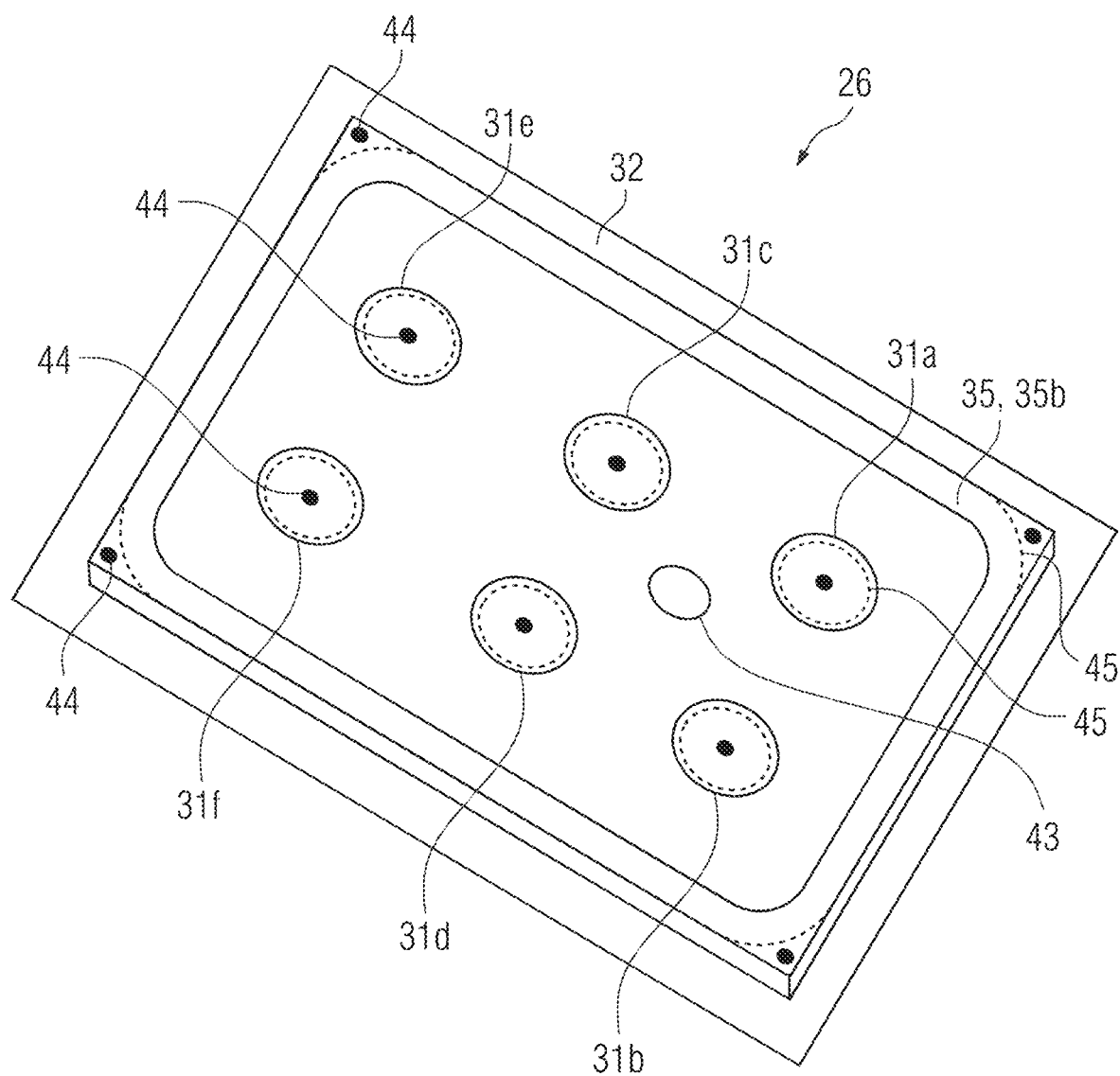
FIG. 5 shows a possible flow chart of a method according to an embodiment of the invention.

FIG. 5 shows another intermediate product of the local coil 26 according to an embodiment of the invention after step S4 of the method according to an embodiment of the invention. In this state, the interspace 38 of the local coil 26 is filled with the fillers 35 and 35b. The surface of the filler 35b is flush with the surfaces of the frame elements 31a-g. As a result, in a subsequent step the second outer skin 33 can be positioned flat on the frame element 31g, the frame elements 31a-f and the filler 35b and can be integrally bonded to the frame element 31g and the frame elements 31a-f. In the example shown, the filler 35b has a recess 43 which provides access to the termination 46 of the antenna array 34. The second outer skin 33 preferably has a complementary recess to allow the electrical connecting cable 27 and/or the socket 41 to be electrically connected to the termination 46 of the antenna array 34. In FIG. 5, the frame element 31g and the frame elements 31a-f have an imaginary cutting line (dashed). In step S6, the frame element 31g and the frame elements 31a-f are preferably cut out along this imaginary cutting line to obtain a desired shape of the local coil 26 and to produce the ventilation openings 42. As shown in FIG. 5, an edge region of the frame elements 31a-f is retained after cutting out, in order to reinforce the inner edge of the ventilation openings 42 and/or to provide a dimensionally stable surface for the integral bonding with the first outer skin 32 and the second outer skin 33. The dimensions of the frame elements 31a-g obtained after cutting out are shown merely by way of example and may differ therefrom. For example, the frame element 31g can have a significantly smaller wall thickness after the cutting-out. It is conceivable for the first outer skin 32 to be detached together with the edge region of the frame element 31g along the imaginary cutting line. However, the first outer skin 32 preferably has, relative to the frame element 31g, an overhang which is molded to the peripheral face 36 of the local coil 26 in a further step S7 and is connected thereto. For this purpose, the first outer skin 32 can already have a desired dimension or be subsequently cut out along a cutting line (not shown) which has an overhang relative to the frame element 31g. The procedure for the second outer skin 33 is similar.

In the embodiment shown in FIG. 5, the local coil 26 has an arrangement of holes 44 which are distributed in a predetermined pattern on the frame element 31g and the frame elements 31a-f. These holes 44 are preferably located in the areas of the frame element 31g and the frame elements 31a-f which are detached by cutting out the ventilation openings 42 and the edge region of the frame element 31g. The arrangement of holes 44 can be mated with a corresponding matrix of retaining elements 51 to align the first outer skin 32, the frame element 31g and the frame elements 31a-f in a predetermined position relative to one another. It is also conceivable for the second outer skin 33 and the backing layer (not shown) to also have a corresponding arrangement of holes 44.

Figure 6:
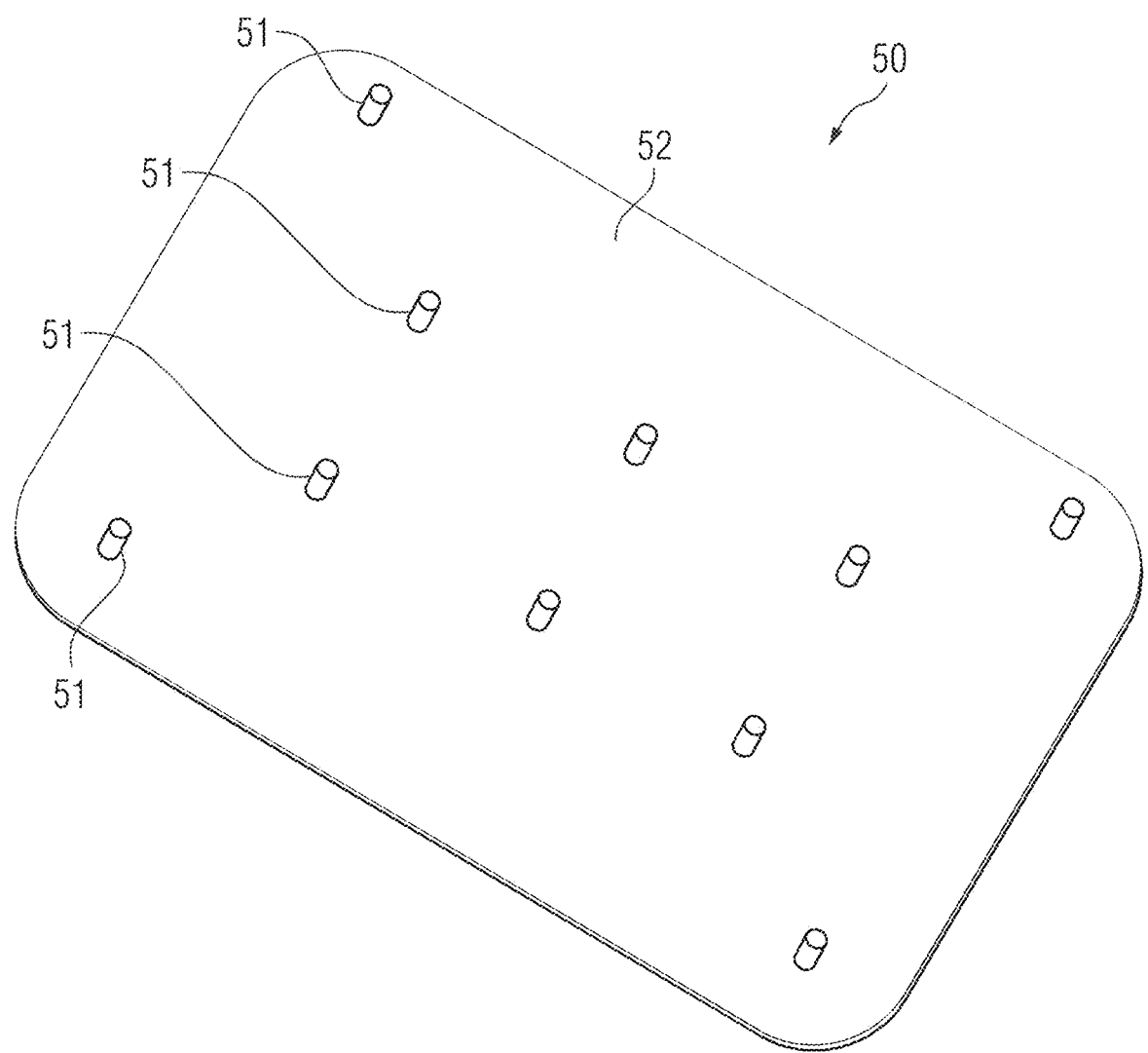
FIG. 6 shows a possible embodiment of a mounting structure according to the invention.

FIG. 6 shows an embodiment of the tool according to the invention for manufacturing the local coil 26 in the method according to the invention. The tool comprises a mounting structure 50 consisting of a flat plate 52 and a matrix of retaining elements 51. In the example shown, the retaining elements 51 are in the form of cylindrical bodies which engage in the arrangement of holes 44 shown in FIG. 5 and align the components of the local coil 26 in a predetermined manner with respect to one another. The pattern of the matrix of retaining elements 51 matches the pattern of the arrangement of holes 44.

Figure 7:
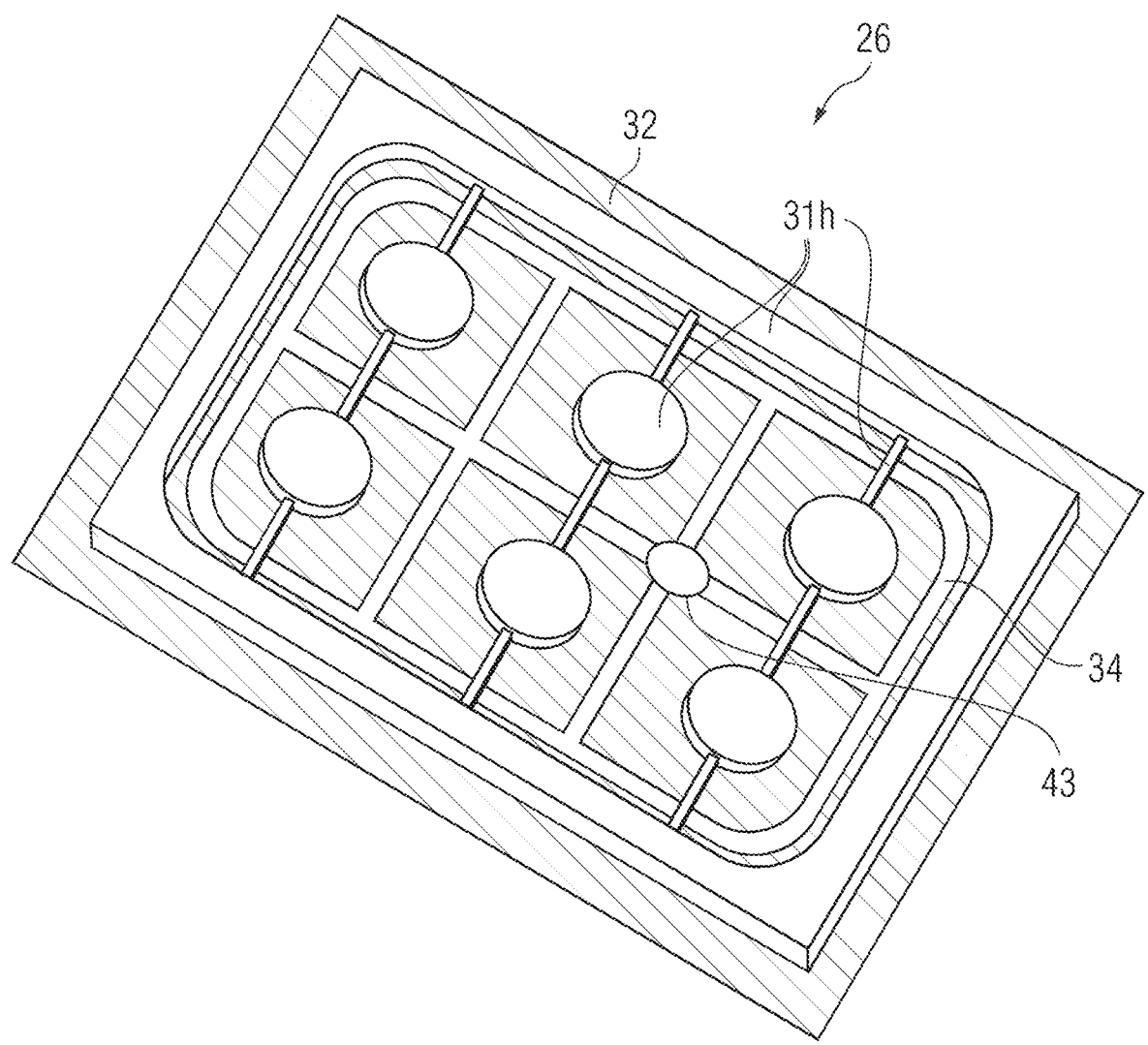
FIG. 7 shows a possible intermediate product of the method according to an embodiment of the invention.

FIG. 7 shows an alternative intermediate product of the method according to an embodiment of the invention. In this embodiment, the cylindrical frame elements 31a-f and the frame element 31g of FIG. 4 are implemented by way of example as a one-piece frame element 31h. The above-described steps S1 and S2 of the method according to the invention are preferably interchanged in this variant, as the antenna array 34 is positioned between the first outer skin 32 and the frame element 31h. FIG. 7 shows the termination 46 of the antenna array 34, which termination is connected to a socket 41 in subsequent steps.

Figure 8:
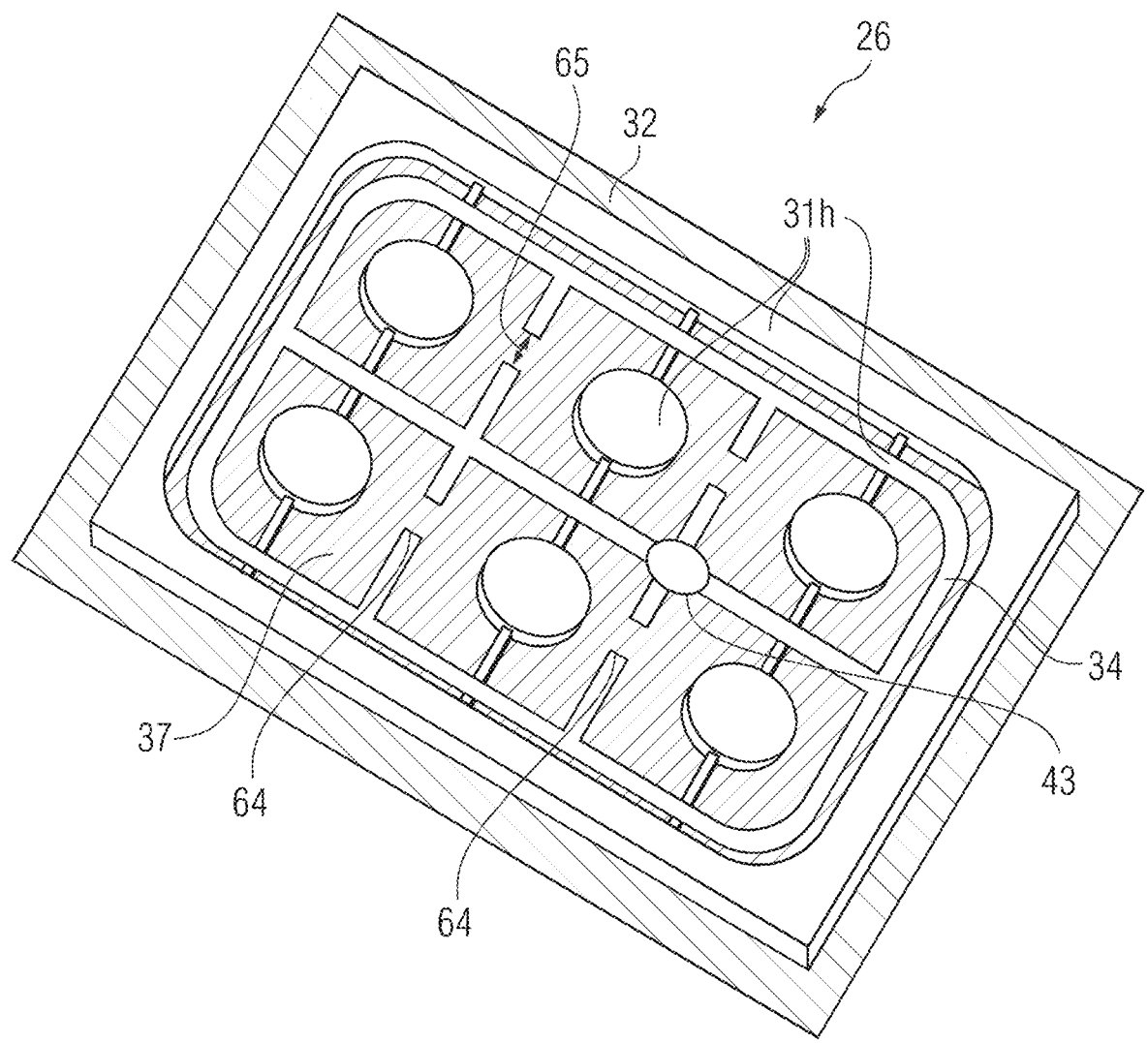
FIG. 8 shows a possible intermediate product of the method according to an embodiment of the invention.

FIG. 8 shows a possible intermediate product of the method according to an embodiment of the invention, in which the antenna of the antenna array 34 is guided reciprocally through slots 64 in the backing layer 37. Two slots 64 in each case are positioned at a small distance 65 from one another, so that the antennas are guided via the gap 65 on a side of the backing layer 37 facing the first outer skin 32. The antenna can, for example, have pluggable connecting elements (not shown) which allow the antenna to be opened at predetermined positions in order to facilitate the reciprocal routing through the backing layer 37. In this embodiment, the backing layer 37 preferably has through-holes or openings matched to the shape of the cylindrical parts of the frame element 31h. The cylindrical parts of the frame element 31h are preferably positioned in the through-holes of the backing layer 37 so that a side of the cylindrical parts of the frame element 31h facing the first outer skin 32 is connected to the first outer skin 32. Preferably, the first outer skin 32 and the cylindrical parts of the frame element 31h are integrally bonded to one another.

Figure 9:
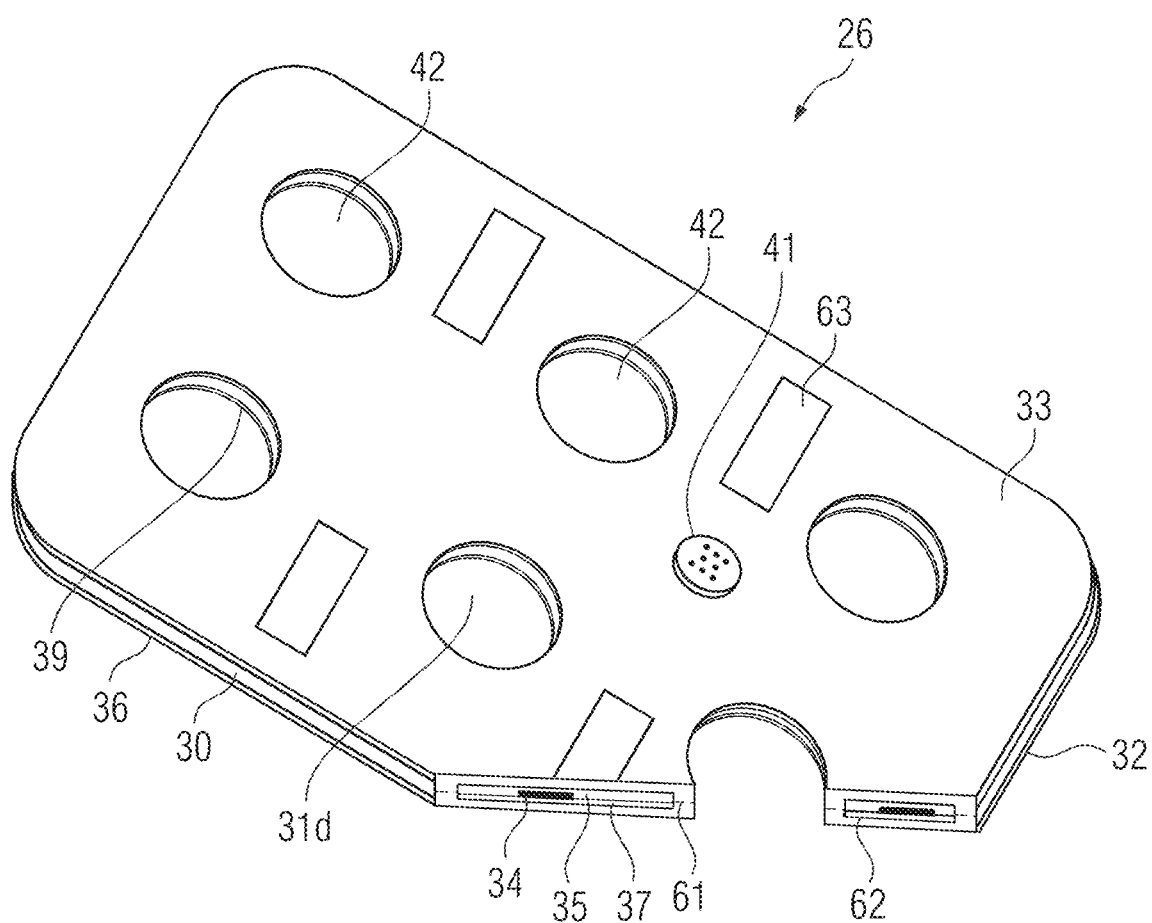
FIG. 9 shows a possible embodiment of the local coil according to the invention.

FIG. 9 shows a possible embodiment of the local coil 26 having a flat carrier body 30 consisting of two halves that are integrally bonded to one another along a bonding surface 61. The two halves of the flat carrier body have a recess 62 on a side facing the antenna array 34 in each case which form the interspace 38 when the two halves are properly joined together. In the example shown, the interspace 38 is filled with the backing layer 37, the filler 35 and the antenna array 34. The local coil 26 also comprises four holding devices 63 that are loop sides of a hook-and-loop fastening. The local coil 26 can be molded to the shape of the patient and secured to the patient via an elastic band or strap having corresponding hooks of the hook-and-loop fastening. In the example shown, the holding devices 63 are integrally bonded to the second outer skin 33.

Although the invention has been illustrated and described in detail by the preferred example embodiments, the invention is not limited by the examples disclosed and other variations will be apparent to the person skilled in the art without departing from the scope of protection sought for the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:
1. A local coil, comprising:
a flat carrier body;
at least one ventilation opening; and
an antenna array to receive RF signals in a frequency and power range of a magnetic resonance device, the antenna array including a termination to establish an electrical connection to the magnetic resonance device, wherein the antenna array is embedded in the local coil, a first outer skin and a second outer skin enclosing the flat carrier body on two main surfaces facing away from one another, wherein the first outer skin and the second outer skin are disjunctively and integrally bonded to the flat carrier body, wherein the flat carrier body includes a reversibly deformable material and is moldable to a shape of the patient, and wherein the local coil includes at least one filler, the at least one filler being unattachedly embedded in the flat carrier body and designed to reduce transmission of at least one of a shear force and a bending force in the local coil upon the local coil being molded to the shape of a patient.

2. The local coil of claim 1, wherein the first outer skin and the second outer skin extend from a main surface of the local coil, round to at least one of a peripheral face of the local coil and an inner face of the at least one ventilation opening, and are integrally bonded to the flat carrier body, wherein the integral bonding is designed to reduce creasing along at least one of the peripheral face of the local coil and the inner face of the at least one ventilation opening upon the local coil being molded to the shape of the patient.

3. The local coil of claim 2, wherein the at least one of peripheral face of the local coil and the inner face of the at least one ventilation opening have a macroscopically smooth surface.

4. The local coil of claim 2, wherein the local coil further comprises:
a holding device designed to attach the local coil to a body region of the patient and mold the local coil to the shape of the patient in a position suitable for use.

5. The local coil of claim 2, wherein an antenna of the antenna array is embedded in the local coil in an unattached manner and is displaceable relative to the at least one filler upon the local coil being molded to the shape of the patient.

6. The local coil of claim 1, wherein the at least one of peripheral face of the local coil and the inner face of the at least one ventilation opening have a macroscopically smooth surface.

7. The local coil of claim 1, wherein the local coil further comprises:
a holding device designed to attach the local coil to a body region of the patient and mold the local coil to the shape of the patient in a position suitable for use.

8. The local coil of claim 1, wherein an antenna of the antenna array is embedded in the local coil in an unattached manner and is displaceable relative to the at least one filler upon the local coil being molded to the shape of the patient.

9. The local coil of claim 1, wherein the second outer skin includes a recess positioned essentially concentrically with respect to the termination of the antenna array, and wherein an edge of the recess of the second outer skin is connected to a socket designed to electrically connect the termination of the antenna array to an electrical connecting cable.

10. The local coil of claim 1, wherein at least a part of the antenna array is guided reciprocally through slots in at least one of the at least one filler and a backing layer, and wherein displacement of the antenna array within the local coil is prevented via the reciprocal guiding in the slots.

11. The local coil of claim 1, wherein at least one of the at least one filler and a backing layer include a retaining structure, designed to hold an electronic circuit in a position.

12. A magnetic resonance system, comprising:
a magnetic resonance device;
the local coil of claim 1; and
an electrical connecting cable, electrically connected to the termination of the antenna array and the magnetic resonance device and designed to establish a signal connection between the magnetic resonance device and the antenna array.

* * * * *